United States Patent
Moret et al.

(10) Patent No.: US 12,411,296 B2
(45) Date of Patent: Sep. 9, 2025

(54) REWORKABLE ZERO-FORCE INSERTION ELECTRICAL OPTICAL PACKAGE SOCKET AND METHOD

(71) Applicant: Intel Corporation, Santa Clara, CA (US)

(72) Inventors: Eric J. M. Moret, Beaverton, OR (US); Pooya Tadayon, Portland, OR (US); Karumbu Meyyappan, Portland, OR (US); Paul J. Diglio, Gaston, OR (US)

(73) Assignee: Intel Corporation, Santa Clara, CA (US)

( * ) Notice: Subject to any disclaimer, the term of this patent is extended or adjusted under 35 U.S.C. 154(b) by 682 days.

(21) Appl. No.: 17/548,167

(22) Filed: Dec. 10, 2021

(65) Prior Publication Data

US 2023/0185037 A1    Jun. 15, 2023

(51) Int. Cl.
 *G02B 6/42* (2006.01)
(52) U.S. Cl.
 CPC ........... *G02B 6/428* (2013.01); *G02B 6/4269* (2013.01); *G02B 6/4284* (2013.01)

(58) Field of Classification Search
 CPC ..... G02B 6/428; G02B 6/4269; G02B 6/4284
 See application file for complete search history.

(56) References Cited

U.S. PATENT DOCUMENTS

| | | | |
|---|---|---|---|
| 6,470,103 B2 | 10/2002 | Watanabe | |
| 10,234,644 B1 | 3/2019 | Butler et al. | |
| 2004/0201323 A1* | 10/2004 | Wong | H01H 57/00 310/328 |
| 2009/0001576 A1 | 1/2009 | Tuli et al. | |

OTHER PUBLICATIONS

Extended European Search Report from European Patent Application No. 22206264.8 notified May 17, 2023, 9 pgs.

* cited by examiner

*Primary Examiner* — Chad H Smith
(74) *Attorney, Agent, or Firm* — Essential Patents Group, LLP

(57) ABSTRACT

An electronic device comprises an electro-optical circuit package including at least photonic integrated circuit (PIC) having at least one light source and a package substrate; a printed circuit (PCB) including at least one optical connector to receive light from the at least one light source; and multiple liquid metal electrical contacts disposed between the package substrate and the PCB.

23 Claims, 13 Drawing Sheets

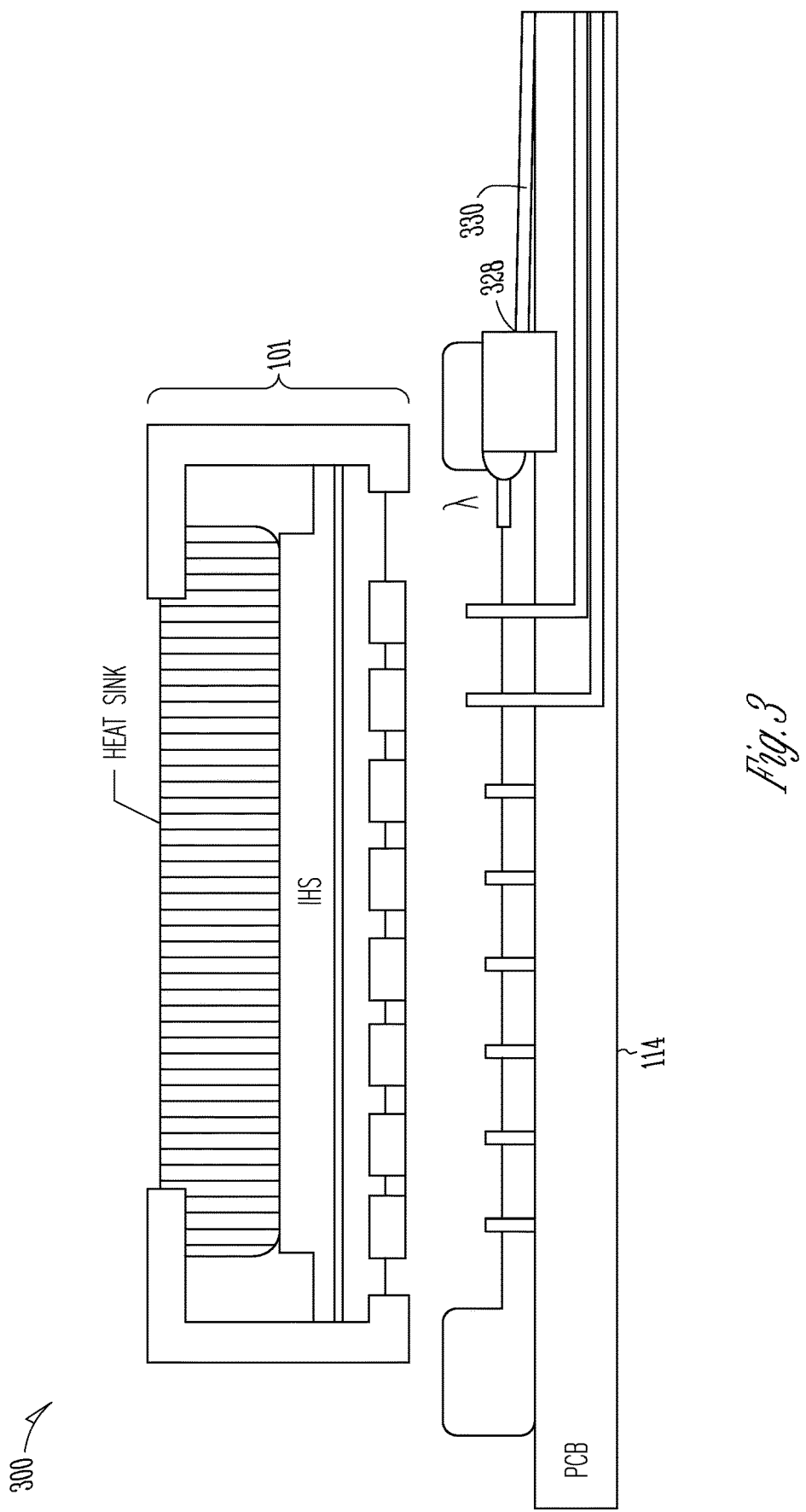

REWORKABLE ZERO-FORCE INSERTION ELECTRICAL OPTICAL PACKAGE SOCKET AND METHOD

TECHNICAL FIELD

Embodiments pertain to packaging of photonic integrated circuits (PICs). Some embodiments relate to techniques to couple an optical signal from a PIC to a waveguide or optical fiber.

BACKGROUND

A photonic integrated circuit (PIC) can generate an optical signal. Optically coupling the optical signal to a waveguide allows the optical signal to be used in an optical interface that could be used as a high-speed interface between electronic devices. A conventional approach to optically couple a PIC and a fiber or waveguide involves careful alignment and gluing of the optical fibers to the PIC. This approach can be very challenging for high volume manufacturing.

BRIEF DESCRIPTION OF THE DRAWINGS

FIG. 3 is a side view illustration of another example of an assembly including an electro-optical circuit package in accordance with some embodiments;

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Conventional techniques to incorporate optical signaling into electronic packages make high volume manufacturing challenging. These techniques can involve direct coupling of an optical fiber to a photonic integrated circuit (PIC). For example, optical fibers can be glued into V-grooves etched into the edge of the PIC. These direct coupling techniques can involve tight positional tolerances making alignment by the assembly tools challenging. This can result in low throughput and makes the conventional techniques unsuitable for high volume manufacturing.

Figure 1:
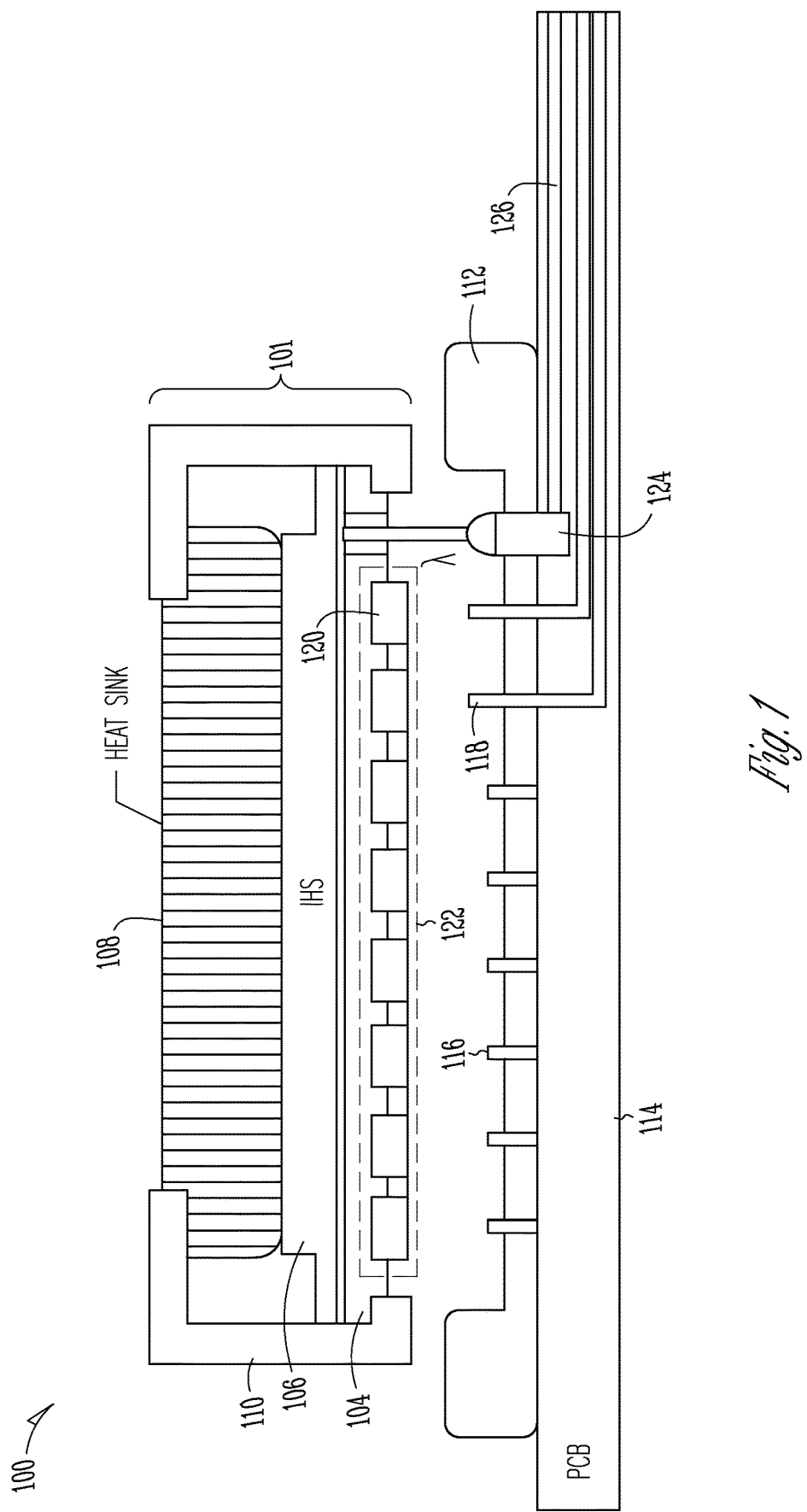
FIG. 1 is a side view illustration of an example of an assembly including an electro-optical circuit package in accordance with some embodiments.

FIG. 1 is a side view illustration of an example of an assembly 100 involving an optical coupling of an optical waveguide and a photonic integrated circuit (PIC) that is scalable to high volume manufacturing. The assembly 100 includes an electro-optical circuit package 101 mounted on a package substrate 104. The electro-optical circuit package 101 includes one or more integrated circuits (not shown). The integrated circuits include the PIC and can include one or more processors (e.g., a central processing unit (CPU), graphics processing unit (GPU), etc.) and memory (e.g., high bandwidth memory (HBM), etc.). The PIC can include a light source (e.g., a laser diode). The electro-optical circuit package 101 also includes an integrated heat spreader (IHS) 106. A heat sink 108 can be attached to the IHS 106 using clamp 110.

The electro-optical circuit package 101 is placed in a package socket 112 that is mounted on a printed circuit board (PCB) 114. The package socket 112 may be a pin socket that includes pins 116 to contact the package substrate 104, or the PCB includes the pins 116 and the pins 116 pass through opening of the package socket 112. The package socket 112 or PCB 114 also includes longer pins 118 that include one or more of power, ground, and control pins to contact the package substrate 104. The electro-optical circuit package 101 includes liquid metal electrical contacts 120 to contact the pins 116, 118. The liquid metal electrical contacts 120 may be included on the circuit package substrate 104 or the liquid metal electrical contacts 120 may be included in an interposer 122 contacting the circuit package substrate 104. In some examples, the interposer 122 may be placed on the package socket 112 separately before the circuit package substrate 104 is placed on the package substrate. The circuit package substrate 104 may include pins or pads (not shown) to contact the interposer 122.

For complex integrated circuit designs, the number of connections needed between a circuit package and the package socket can become large. This can lead to a high insertion force needed in conventional attachment techniques. The liquid metal electrical contacts 120 allow for a zero-insertion force package. The liquid metal of the liquid metal electrical contacts 120 can be any metal that has a melting point at or near room temperature. Some examples include cesium, gallium, and rubidium. In some examples, the liquid metal is an alloy of gallium and indium, The liquid metal may also be a eutectic that is an alloy having a melting point at or near room temperature. In some examples, a sealing film, or cap seal, may be used to hold the liquid metal in place until attachment is made. An interposer 122 may include a cap seal on both the top and bottom sides of the interposer. In some examples, the liquid metal has a zero flow rate, and a cap seal is not needed.

The assembly 100 also includes an optical connector 124 connected to a waveguide 126. The waveguide 126 is shown embedded in the PCB 114 but the waveguide 126 may be external to the PCB 114. An optical signal (shown as λ) from the light source of the IC is used to align the circuit package and the package socket 112. A positioning mechanism (e.g., a six-axis positioning mechanism for x, y, z, pitch, yaw, and roll) can adjust the position of the electro-optical circuit package 101 according to the optical signal. For example, the positioning mechanism may move the electro-optical circuit package 101 to find the position with the maximum light intensity from the light source and attach the circuit package to the package socket 112 when the optimized position is found.

To provide power to the PIC light source during alignment, the power and ground pins 118 are longer than the other pins 116. The electro-optical circuit package 101 contacts the power and ground pins 118 first to power the light source before the other pins 116 contact the circuit package. The optimum alignment of the powered light source and the optical connector is then found. The positioning mechanism then lowers the circuit package to complete the connection between pins 116 and the liquid metal electrical contacts 120. An adhesive may be used to complete the attachment. The positioning mechanism may hold the circuit package until adhesive cures.

As explained previously herein, the careful alignment and gluing of the optical fibers to the PIC in a conventional attachment technique can be challenging. In the technique of the example of FIG. 1, powering the light source provides feedback for automatic alignment of the light source and optical connector 124. The liquid metal contact of the power pin provides a flexible power connection for the six-axis movement of the positioning mechanism while the optimum alignment is found. The alignment algorithm may continue to run during the cure process.

Figure 2:
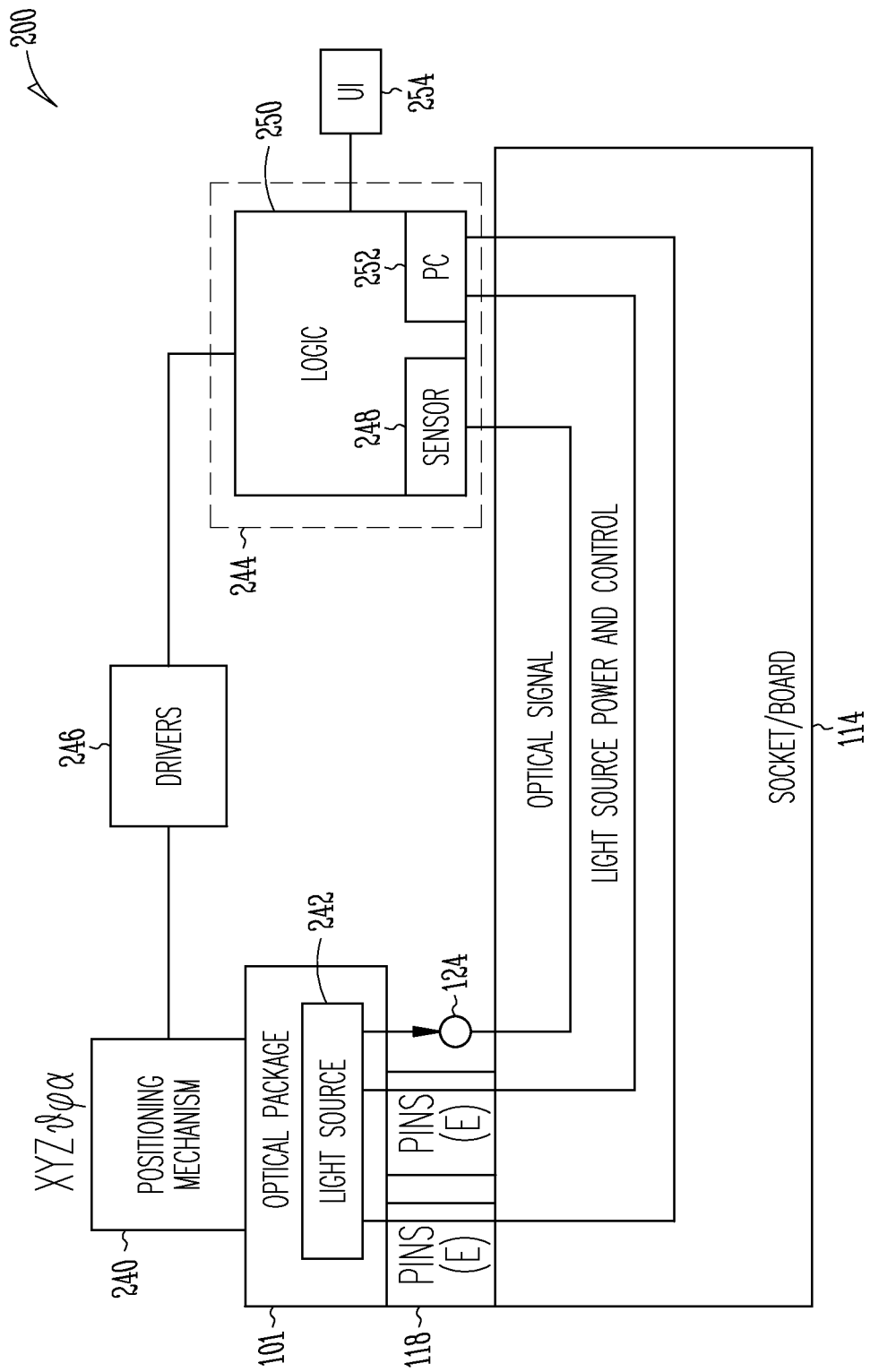
FIG. 2 is a conceptual block diagram of an example of an optical alignment system in accordance with some embodiments.

FIG. 2 is a block diagram of an example of an optical alignment system 200 for mounting an electro-optical circuit package 101 to a PCB 114. The functional parts of the system 200 are shown in block form without attempting to show the actual relative sizes of the functional parts. The system 200 includes a six-axis positioning mechanism 240 to align the electro-optical circuit package 101 and the PCB 114. The system 200 includes a positioning circuit 244 that includes a light sensor 248, logic circuitry 250, and power and control (PC) interface 252.

Active feedback for the positioning mechanism 240 is provided by the optical signal from the light source 242 of the PIC. The power and control interface 252 provides power to the light source 242 of the PIC through the pins 118 of the PCB 114. The optical connector 124 receives the optical signal from the light source 242 which is detected on waveguide 126 by the light sensor 248 (e.g., a photo diode). The logic circuitry 250 provides one or more positioning control signals to drivers 246 of the six-axis positioning mechanism 240 in response to the optical signal. In some examples, one or more of the light sensor 248, logic circuitry 250, and power and control interface 252 can be included on the PCB board 114.

The logic circuitry 250 may perform an algorithm to move the position of the electro-optical circuit package 101 to maximize the light intensity of the optical signal. The control signals from the positioning circuit 244 may cause the drivers 246 to move the positioning mechanism 240 in movement search windows of dimensions of 100 microns (100 μm) or less to find the position of the electro-optical circuit package 101 with optimized alignment. A user interface 254 (UI) may be provided to make changes to the algorithm performed by the logic circuitry 250. In an alternative, the positioning mechanism 240 may be attached to the PCB 114 and the logic circuitry 250 moves the position of the PCB 114 relative to the electro-optical circuit package 101 to maximize the light intensity of the optical signal.

The light source 242 of the PIC may include any device that generates an optical signal (e.g., a laser emitting diode, a light emitting diode (LED), etc.). In the example of FIGS. 1 and 2, the optical signal is emitted vertically from the circuit package (e.g., a vertical-emitting diode) and the optical connector 124 is arranged vertically from the circuit package for a bottom optical signal coupling.

FIG. 3 is a side view of another assembly 300 in which the light source of the PIC is a side-emitting diode. The PCB 314 includes the optical connector 328 mounted to the side of the circuit package for an edge optical signal coupling. The waveguide 330 connected to the optical connector 328 is external to the PCB 314 in the example of FIG. 3. The process of mounting the electro-optical circuit package 101 to the PCB 314 in FIG. 3 is similar to the process described regarding FIG. 1.

Figure 4A:
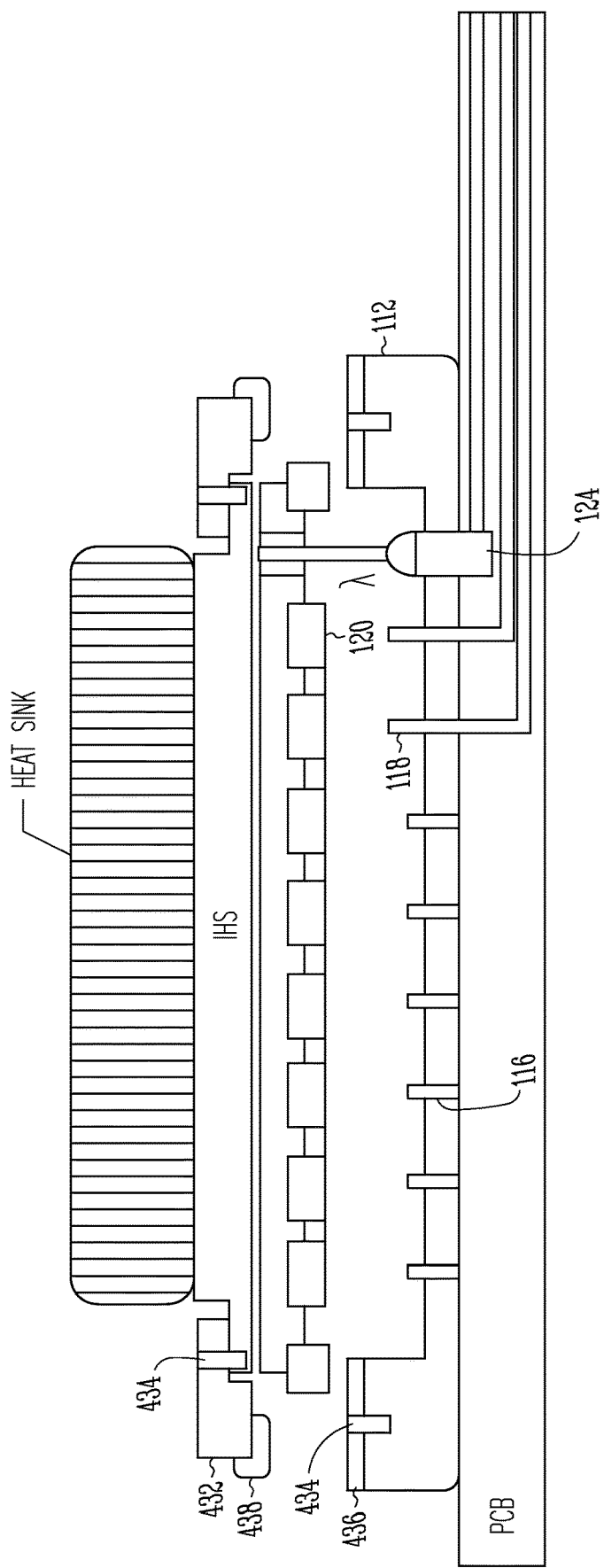
FIGS. 4A-4B are illustrations of an example of a method to automatically socket an electro-optical circuit package in accordance with some embodiments.
Figure 4B:
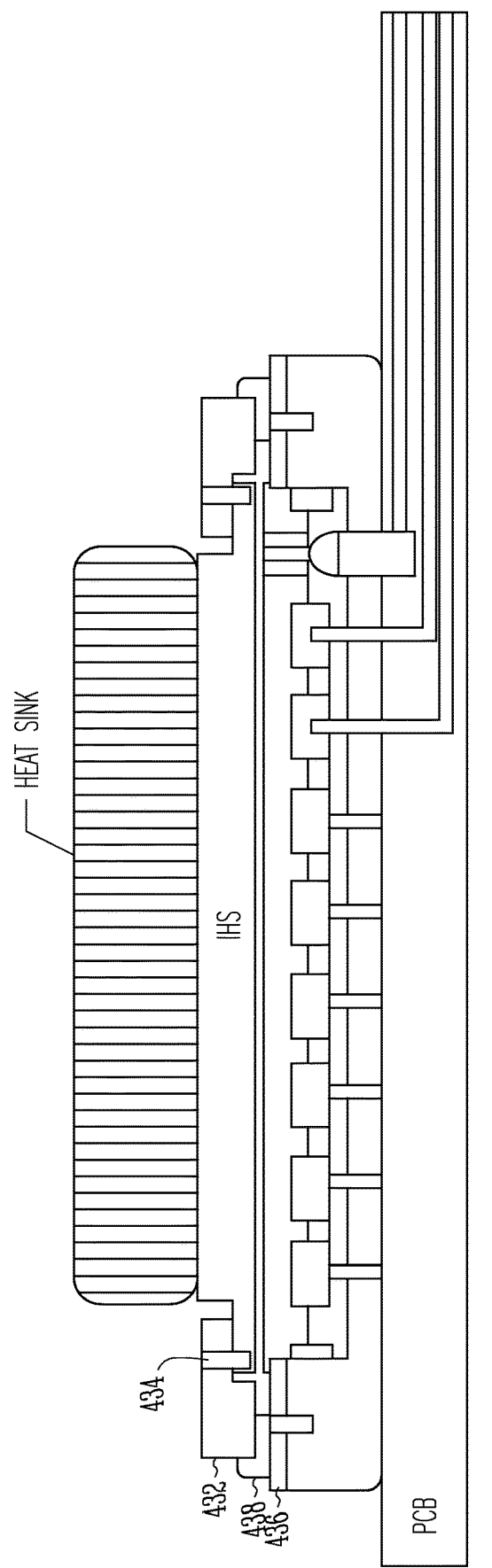

FIGS. 4A-4B are illustrations of an example of a method to automatically socket the electro-optical circuit package 101 of FIG. 1 into the package socket 112. A removable frame or set of one or more removable tabs 432 is added to the electro-optical circuit package 101. The removable tabs 432 or removable frame contact one or both of the package substrate 104 and the IHS 106. The removable tabs 432 may be a removable frame that extends around the circumference of the electro-optical circuit package 101 and IHS 106, or the removable tabs 432 may extend around only a portion of the circumference. One or more temporary fasteners 434 (e.g., a screw, pin, etc.) may be used to attach the one or more tabs to the package substrate 104 or the IHS 106. One or more removable landing pads 436 for the one or more removable tabs 432 is added to the package socket 112. One or more temporary fasteners 434 may be used to attach the landing pads 436 to the package socket 112.

To socket the electro-optical circuit package 101, an adhesive 438 can be applied to one or both of the removable tabs 432 and the removable landing pads 436. The electro-optical circuit package 101 and removable tabs 432 are lowered toward the package socket 112 and removable landing pads 436 to an alignment separation so that the liquid metal electrical contact 120 contact at least one of a power or ground pin 118 to provide power to the light source of the PIC. Alignment is then performed to optimize the optical signal from the light source received by the optical connector 124.

FIG. 4B shows the electro-optical circuit package 101 and removable tabs 432 lowered onto the package socket 112 and landing pads 436. The liquid metal electrical contacts 120 contact the pins 116 of the PCB 114 or package socket 112, and the light source has optimized alignment to the optical connector 124. The adhesive 438 can be cured (e.g., thermal curing, or ultraviolet (UV) light curing, etc.). The optical alignment system may hold the electro-optical circuit package 101 in place while the adhesive cures to hardening.

Figure 5A:
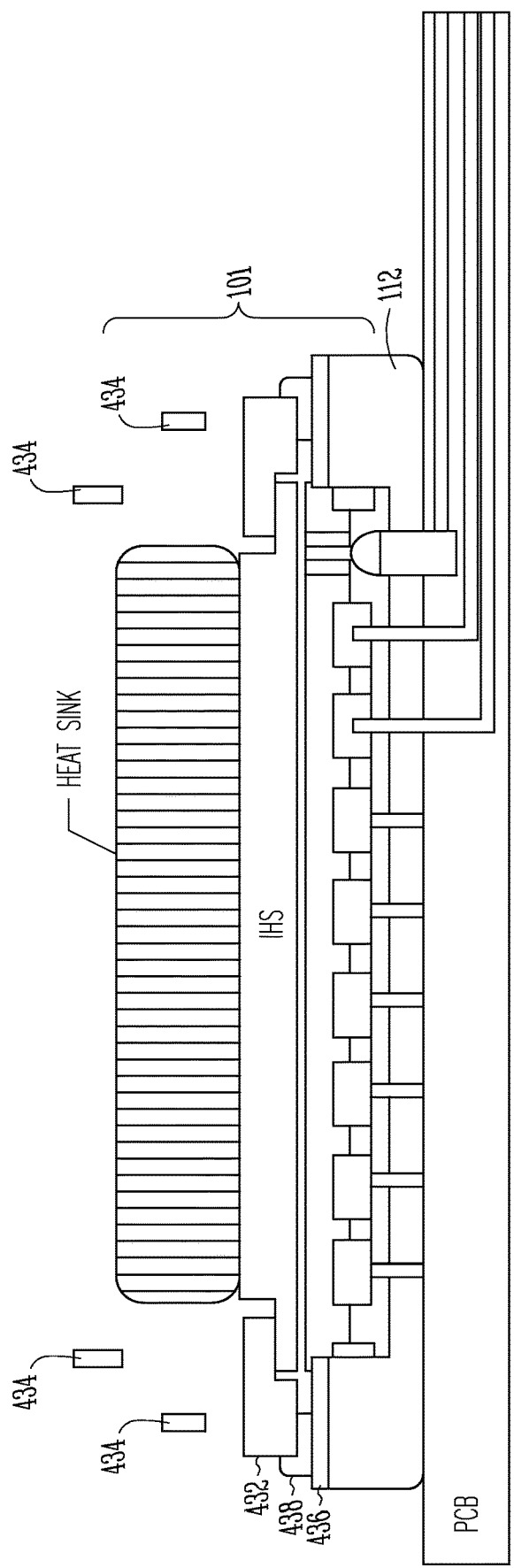
FIGS. 5A-5B are illustrations of an example of a method to de-socket the electro-optical circuit package in accordance with some embodiments.
Figure 5B:
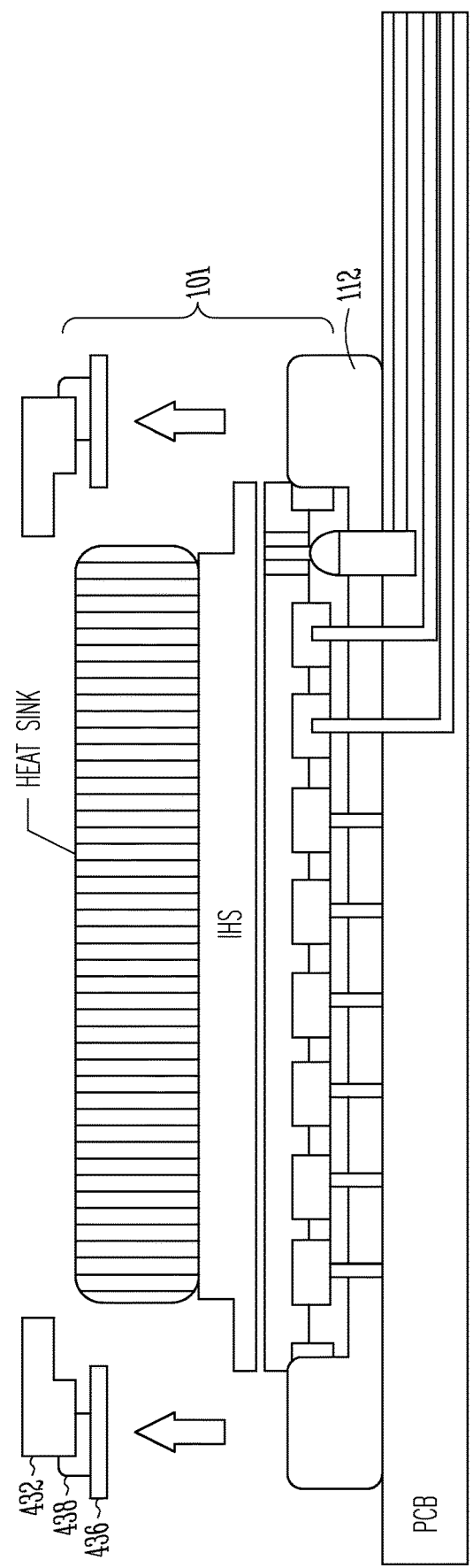

FIGS. 5A-5B are illustrations of an example of a method to de-socket the electro-optical circuit package 101 of FIG. 1 from the package socket 112. In FIG. 5A the temporary fasteners 434 are removed. In FIG. 5B, the removable tabs 432 and removable landing pads 436 are removed. Because the electrical contacts are liquid metal electrical contacts and not hardened solder, the electro-optical circuit package 101 can be lifted from the package socket 112.

The removable tabs 432 and removable landing pads 436 may be removed together. In some examples, the hardened adhesive 438 may be dissolved or broken during the de-socketing and the removable tabs 432 and removable landing pads 436 removed separately. The removable tabs 432 and removable landing pads 436 may be discarded or cleaned and reused.

Other arrangements of the elements of the electro-optical circuit package 101 and the package socket 112 are possible. For example, the liquid metal electrical contacts 120 may be included on the package socket 112. The package substrate 104 of the electro-optical circuit package 101 may include the pins 118 and 116 for contacting the liquid metal electrical contacts 120. In another arrangement, the package socket 112 of the PCB 114 is adjusted using the optical alignment system to align the optical connector 124 of the package socket 112 and the light source of the PIC.

Figure 6:
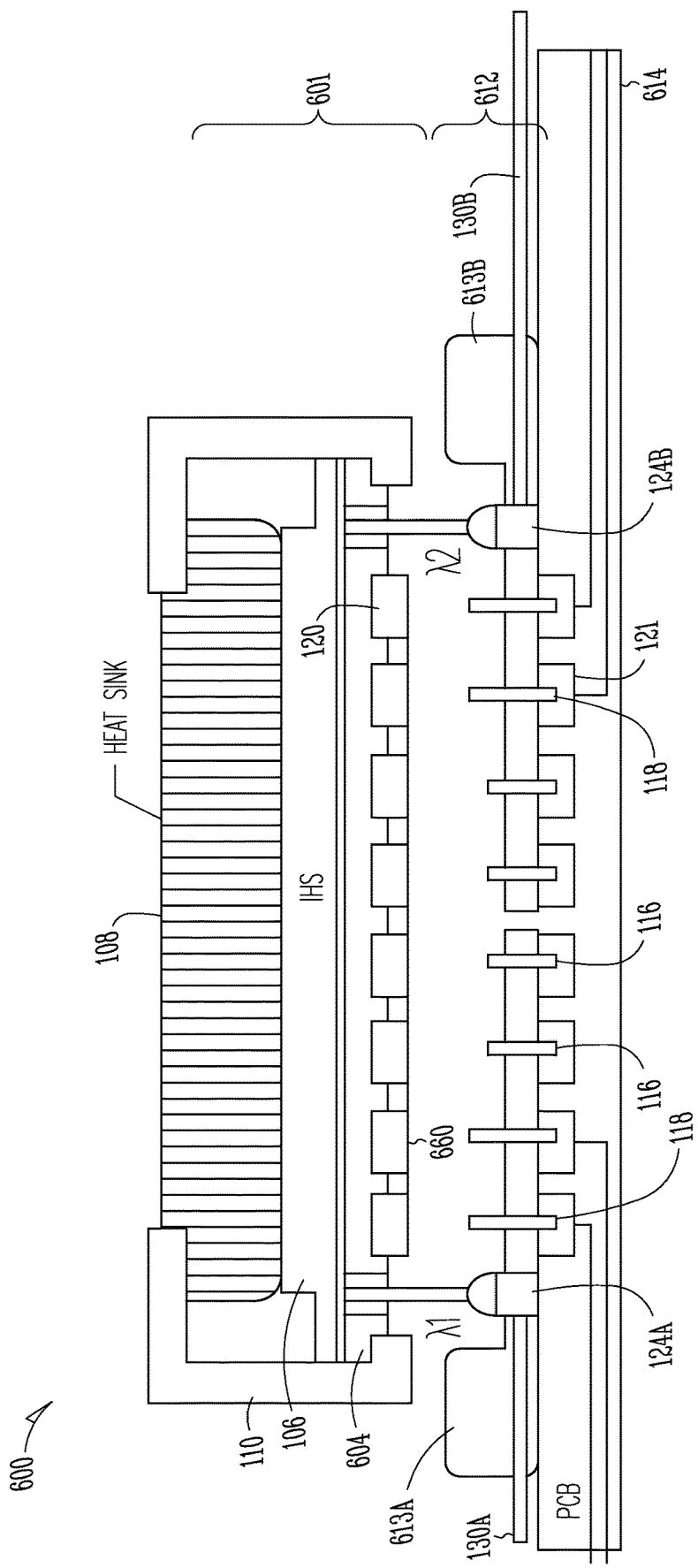
FIG. 6 is a side view illustration of another example of an assembly that includes an electro-optical circuit package in accordance with some embodiments.

FIG. 6 is a side view illustration of another example of an assembly 600 that includes an electro-optical circuit package 601. The electro-optical circuit package 601 includes one or more PICs and is similar to the electro-optical circuit package 101 of FIG. 1. The electro-optical circuit package 601 includes package substrate 104, an IHS 106, heat sink 108, and clamp 110 to hold heat sink to the IHS 106. The assembly 600 includes a packet socket 612 having multiple zones that are movable relative to each other. The example in FIG. 6 shows two socket zones (Zone 1 and Zone 2 labeled as 613A, 613B, respectively) but a package socket may have more than two socket zones (e.g., four socket zones). The multi-zoned package socket 612 is a pin socket that includes pins 116 and 118. The assembly 600 includes two sets of liquid metal electrical contacts. A first set of liquid metal electrical contacts 120 is shown attached to the electro-optical circuit package 601 and a second set of liquid metal electrical contacts 121 included with the PCB 614. One or both sets of liquid metal electrical contacts may include a sealing film 660. As noted in regard to the example of FIG. 1, the first set of liquid metal electrical contacts 120 may be included in a separate interposer.

The electro-optical circuit package 602 includes two light sources, one for each socket zone. The light source can be included in one or two PICs of the electro-optical circuit package 602. The electro-optical circuit package 602 may include more than one light source for one socket zone. Each socket zone includes pins 118 which include one or both of a power pin and a ground pin longer than pins 116 to contact the first set of liquid metal electrical contacts 120 without the other pins 116 contacting the first set of liquid metal electrical contacts 120. The pins 118 of the socket zone provides power for the light source corresponding to the socket zone. This allows the light sources to be powered with an adjustment separation between the electro-optical circuit package 601 and the multi-zoned package socket 612.

Each socket zone 613A, 613B includes an optical connector 124A, 124B. Each optical connector is connected to a waveguide 130A, 130B external to the PCB 614. The optical connector of the socket zone receives an optical signal (shown as $\lambda_1$, $\lambda_2$) from the light source corresponding to the socket zone. Each socket zone is positioned to optimize the optical signal for its socket zone. In some examples, each socket zone 613A, 613B can include more than one light source, optical connector pair. In this case, each socket zone may be positioned for an overall optimization of the intensity of the multiple optical signals corresponding to the socket zone.

Figure 7:
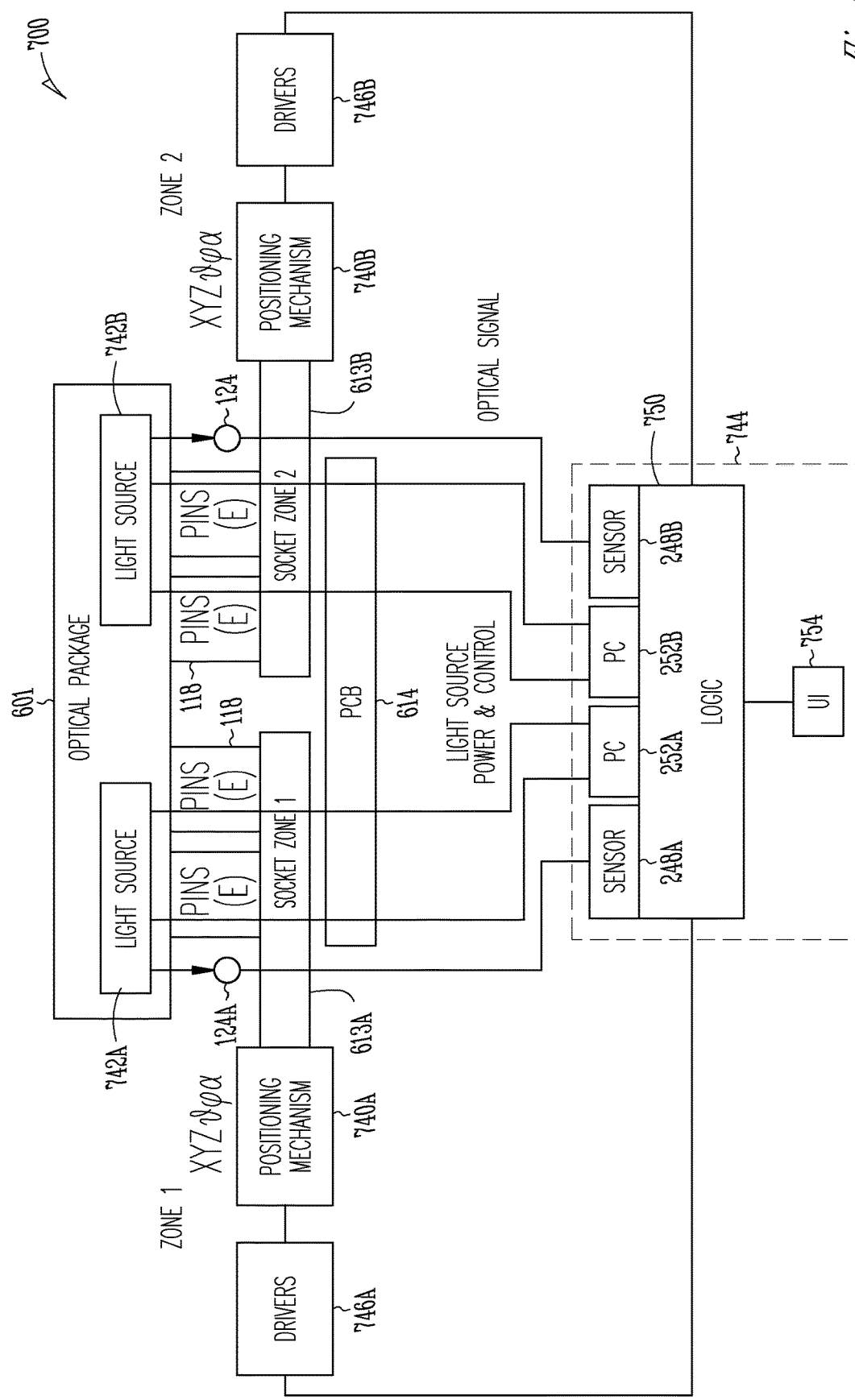
FIG. 7 is a block diagram of an example of an optical alignment system for mounting an electro-optical circuit package to a PCB in accordance with some embodiments.

FIG. 7 is a block diagram of an example of an optical alignment system 700 for mounting an electro-optical circuit package (e.g., electro-optical circuit package 601 in FIG. 6) to a PCB 614 having a multi-zoned package socket (e.g., multi-zoned package socket 612 in FIG. 6). In the example of FIG. 7, the optical alignment system 700 includes two six-axis positioning mechanisms 740A, 740B, to independently position the two socket zones 613A, 613B of the multi-zoned package socket 612. The optical alignment system 700 may include more than two positioning mechanisms to align more than two socket zones (e.g., four positioning mechanisms to independently align four socket zones). The positioning mechanisms 740A, 740B independently align the socket zones 613A, 613B to the light sources 742A, 742B of the electro-optical circuit package 601.

The optical alignment system 700 includes a positioning circuit 744 that includes logic circuitry 650, and a light sensor and a power and control interface for each socket zone. The power and control interfaces 252A, 252B of each socket zone 613A, 613B provide power to the respective light source 742A, 742B through the pins 118 of the socket zone. The system 700 also includes separate drivers 746A, 746B for each of the two positioning mechanisms 740A, 740B.

Active feedback for the positioning mechanism is provided for each socket zone while the socket zone is at the adjustment separation from the electro-optical circuit package 601. For Zone 1, an optical signal from light source 742A is provided to optical connector 124A which is detected on waveguide 130A by light sensor 748A. The logic circuitry 750 provides one or more positioning control signals to drivers 746A of the six-axis positioning mechanism 740A in response to the optical signal. The logic circuitry 750 adjusts the position of the socket zone 613A to optimize the optical signal from light source 742A. Similarly for Zone 2, an optical signal from light source 742B is provided to optical connector 124B which is detected on waveguide 130B by light sensor 248B. The logic circuitry 750 provides one or more positioning control signals to drivers 746B of the six-axis positioning mechanism 740B in response to the optical signal. The logic circuitry 750 adjusts the position of the socket zone 613B to optimize the optical signal from light source 742B.

The control signals from the positioning circuit 744 may cause the drivers 746A, 746B to move the positioning mechanisms 740A, 740B, in movement search windows of dimensions of 100 μm or less to find the position of each socket zone 613A, 613B with optimized alignment. When the optimum alignment is found, the electro-optical circuit package 601 is attached to the multi-zone socket 612 and the PCB 614 with the other pins 116 contacting the liquid metal electrical contacts 120.

Figure 8:
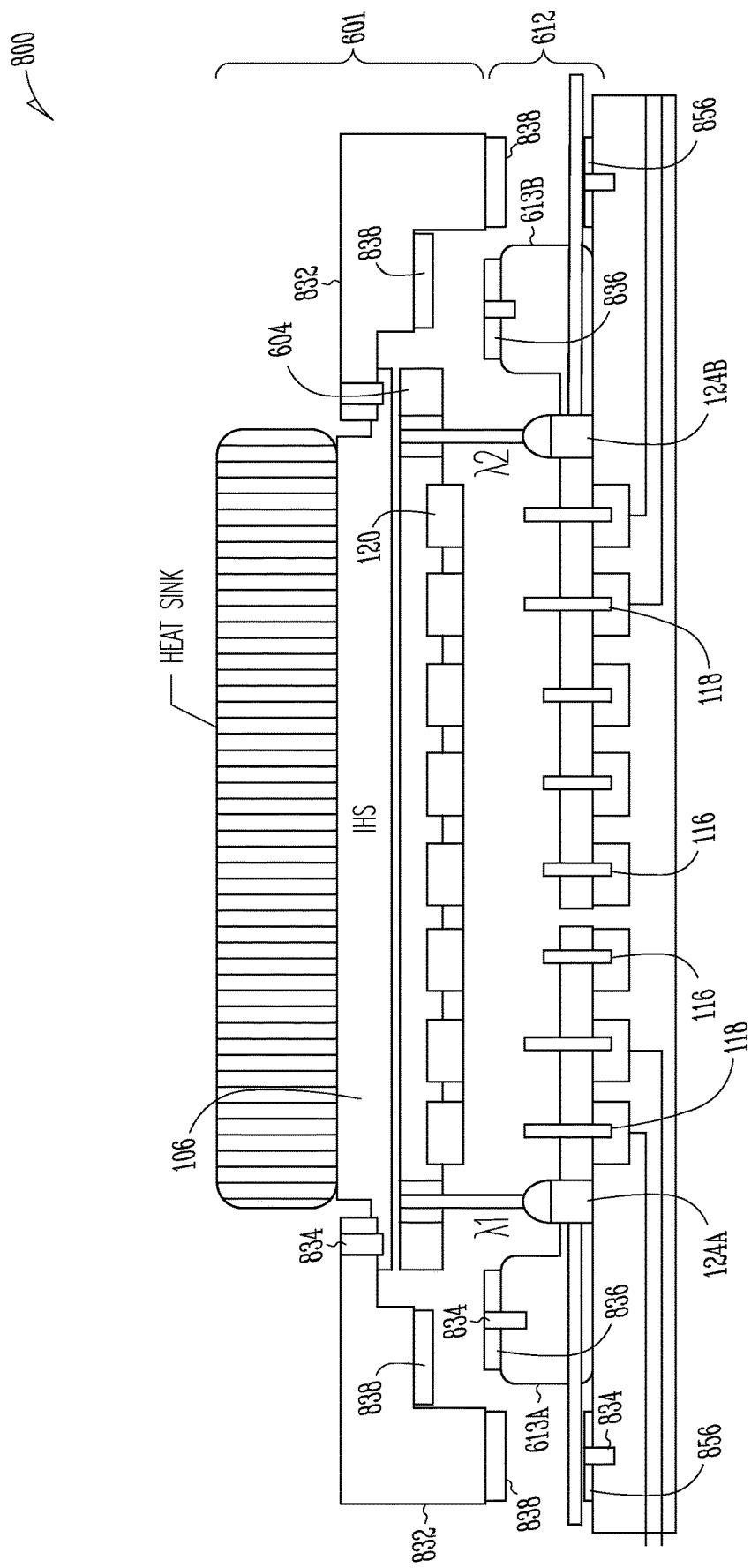
FIG. 8 is a side view illustration of another example of an assembly that includes an electro-optical circuit package in accordance with some embodiments.

FIG. 8 is a side view illustration of another example of an electronic assembly 800 that includes an electro-optical circuit package. The example of FIG. 8 shows removable features for attaching the electro-optical circuit package 601, multi-zoned package socket 612, and PCB 614 of FIG. 6. Removable frame 832 contacts one or both of the package substrate 604 and the IHS 106, and may be a frame around the circumference of the electro-optical circuit package 601 and IHS 106, or around only a portion of the circumference. Temporary fasteners 834 may be used to attach the frame to the package substrate 604 or the IHS 106. The removable frame 832 secures the attachment of both the electro-optical circuit package 601 and the package socket 612 to the PCB 614. A first removable landing pad 836 for the removable frame 832 is included on the package socket 612, and a second removable landing pad 856 is included on the PCB 614. The landing pads 836, 856 may extend around the circumference of the electro-optical circuit package 601 and IHS 106, or around only a portion of the circumference. The landing pads 836, 856 may include multiple sections. One or more temporary fasteners 834 may be used to attach landing pad 836 to the package socket 612, and to attach landing pad 856 to the PCB 614. Adhesive 838 can be applied to one or more of the removable frame 832 and landing pads 836, 856. The electro-optical circuit package 601 can be de-socketed using any of the methods described regarding FIGS. 5A-5B.

Figure 9:
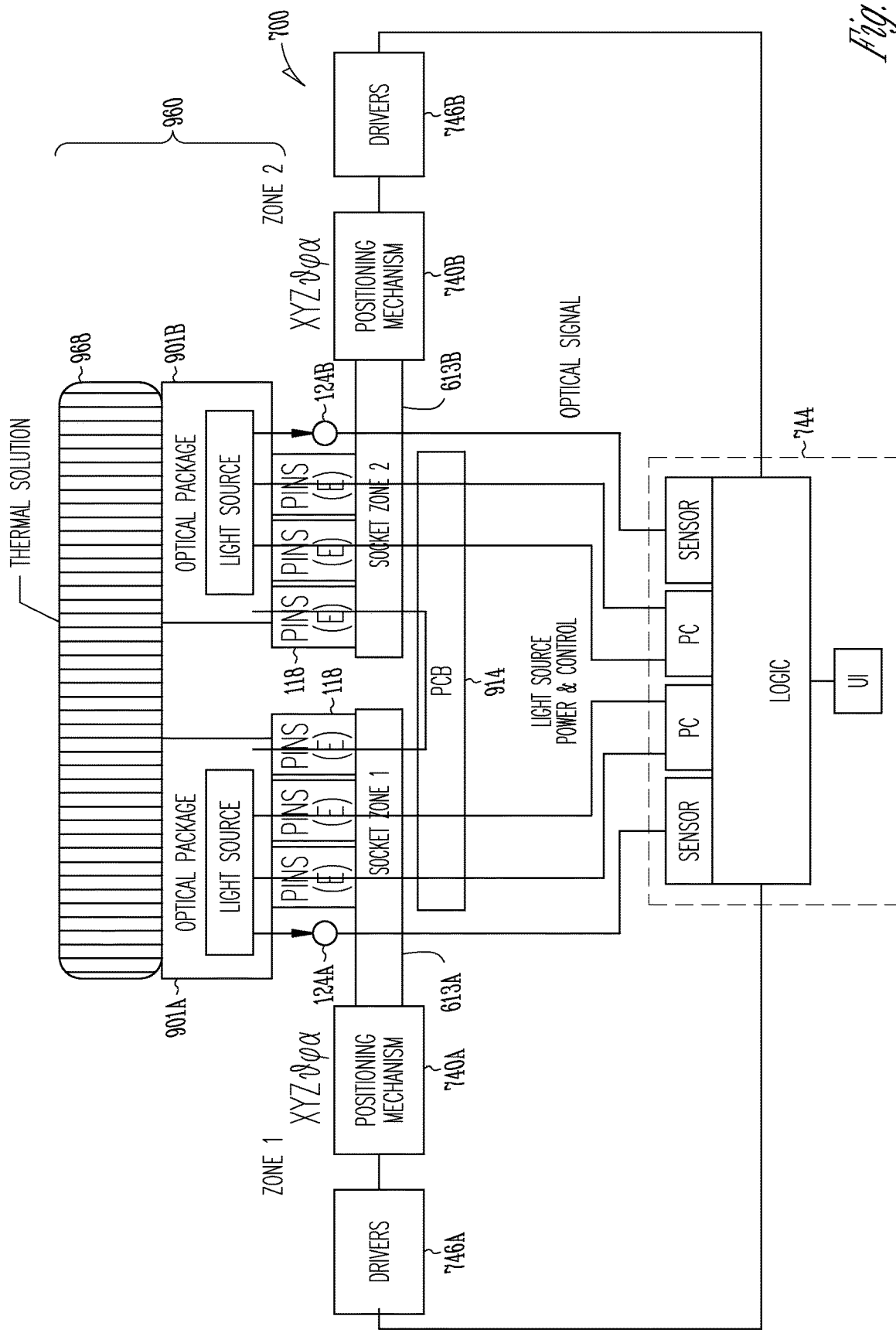
FIG. 9 is an illustration of an example of another application for the optical alignment system of FIG. 7 in accordance with some embodiments.

FIG. 9 is an illustration of another application for the optical alignment system 700 of FIG. 7. An array 960 of electro-optical circuit packages are linked to a common thermal solution 968. Thermal solution 968 may include a heat sink in contact with both electro-optical circuit packages. The example shows two electro-optical circuit packages 901A, 901B, but the array 960 can include more than two electro-optical circuit packages. The two electro-optical circuit packages 901A, 901B can be similar to the electro-optical circuit package 101 of FIG. 1, and may include integrated circuits mounted on a package substrate, an IHS and liquid metal electrical contacts.

The two electro-optical circuit packages 901A, 901B are mounted to a PCB 914 using a package socket having two zones 613A, 613B as in the example of FIG. 6. Pins 118 provide power to light sources 942A, 942B of the electro-optical circuit packages 901A, 901B, respectively. The positioning mechanisms 740A, 740B, independently position the two socket zones 613A, 613B by aligning optical connectors 124A, 124B of the socket zones 613A, 613B to the light sources 942A, 942B. When the optimum alignment is found by the positioning circuit 744, the electro-optical circuit packages 901A, 901B are attached to the multi-zone package socket and the PCB 914 to provide electrical contact to the liquid metal electrical contacts of the electro-optical circuit package 901A. 901B. A removable frame may secure the array 960 of electro-optical circuit packages to the PCB 914. The frame may extend around the circumference of the array 960 of electro-optical circuit packages or around only a portion of the circumference.

Figure 10:
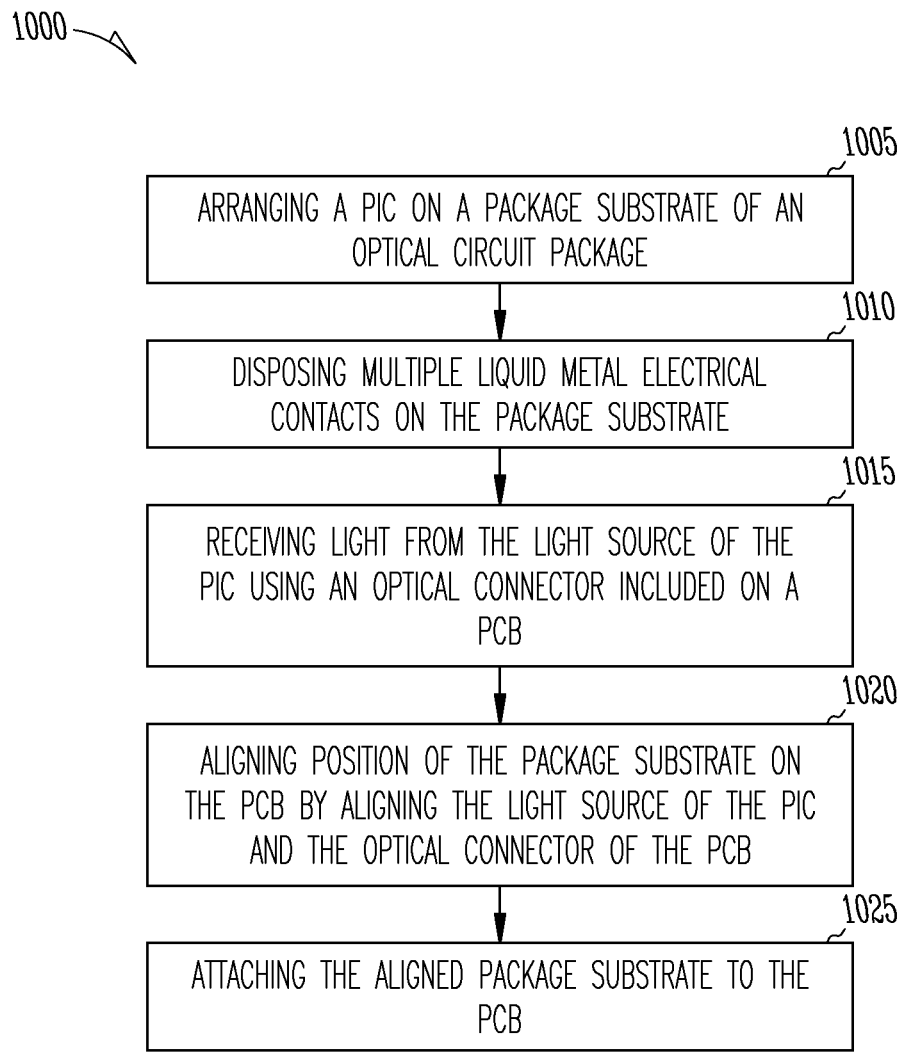
FIG. 10 is a flow diagram of an overview of a method of forming an electronic device in accordance with some embodiments.

For completeness, FIG. 10 is a flow diagram of an overview of a method 1000 of forming an electronic device, such as the electronic device in any of the examples of FIGS. 1-6 and 8. At block 1005, a PIC is arranged on a package substrate of an electro-optical circuit package. The PIC includes at least one light source. At block 1010, multiple liquid metal electrical contacts are disposed on the package substrate. In certain examples, the liquid metal electrical contacts are included in an interposer disposed on the package substrate. The electro-optical circuit package is aligned and attached to a PCB. The alignment and attachment may be formed by any of the example devices of FIGS. 7 and 9.

At block 1015, light from the at least one light source of the PIC is received using an optical connector included on a PCB. At block 1020, the position of the package substrate is aligned to a location on the PCB by aligning the light source of the PIC and the optical connector of the PCB. At block 1025, the package substrate is attached to the PCB.

The electro-optical circuit packages may be included in an optical interface between two or more higher level electronic devices. Using zero-force liquid metal electrical contacts for the devices allows for automatic positioning of the optical elements that is scalable and still provides optimization of the optical coupling. The result is circuit package that is removable for maintenance. An example of a higher level electronic device using assemblies with electro-optical circuit packages as described in the present disclosure is included to show an example of a higher level device application.

Figure 11:
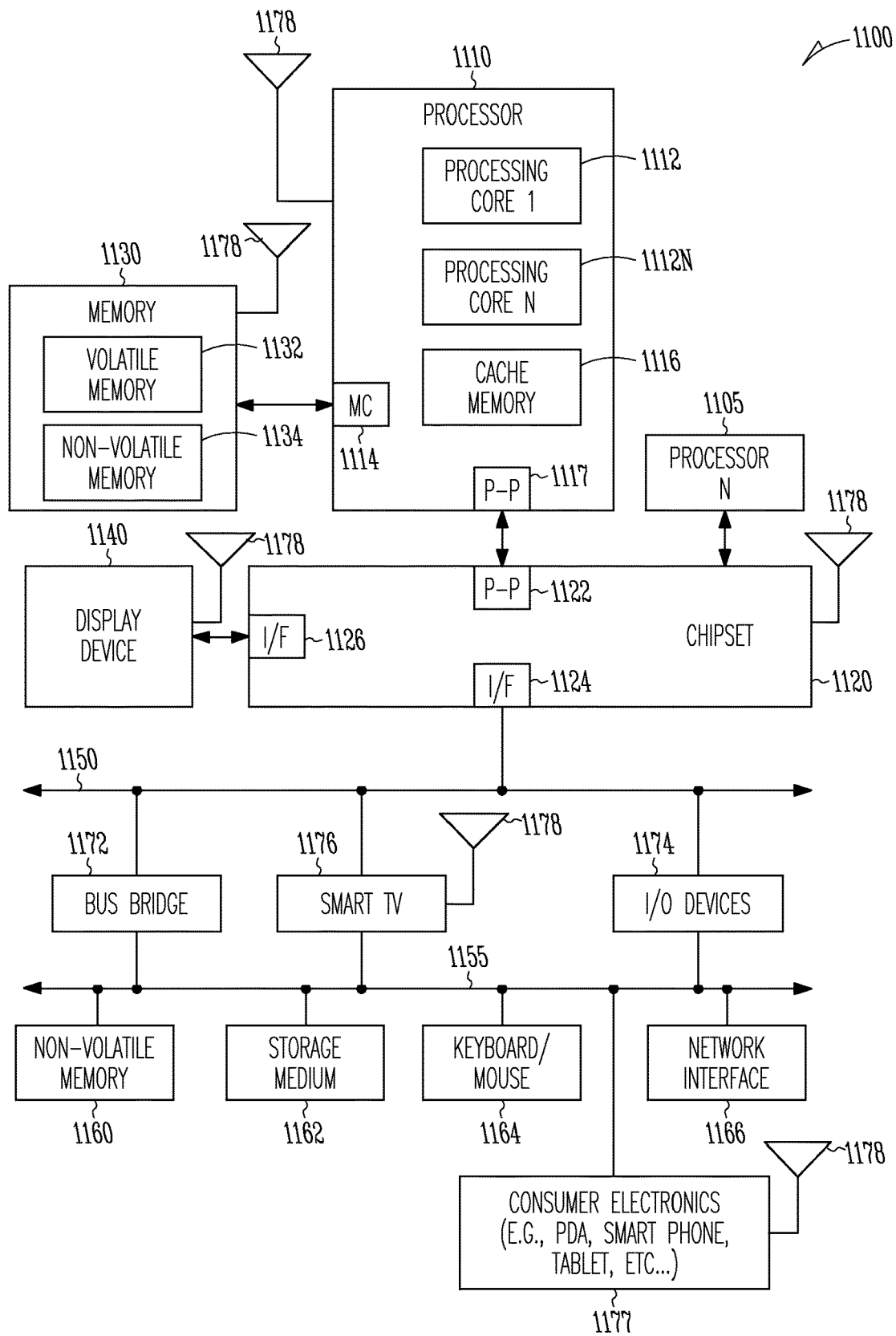
FIG. 11 illustrates a system level diagram in accordance with some embodiments.

FIG. 11 illustrates a system level diagram, according to one embodiment of the invention. For instance, FIG. 11 depicts an example of an electronic device (e.g., system) that can include one or more electro-optical circuit packages as described in the present disclosure. In one embodiment, system 1100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1100 is a system on a chip (SOC) system. In one example, two or more systems as shown in FIG. 11 may be coupled together with an optical interface implemented using one or more electro-optical circuit packages as described in the present disclosure.

In one embodiment, processor 1110 has one or more processing cores 1112 and 1112N, where N is a positive integer and 1112N represents the Nth processor core inside processor 1110. In one embodiment, system 1100 includes multiple processors including 1110 and 1105, where processor 1105 has logic similar or identical to the logic of processor 1110. In some embodiments, processing core 1112 includes, but is not limited to, pre-fetch logic to fetch instructions, decode logic to decode the instructions, execution logic to execute instructions and the like. In some embodiments, processor 1110 has a cache memory 1116 to cache instructions and/or data for system 1100. Cache memory 1116 may be organized into a hierarchal structure including one or more levels of cache memory.

In some embodiments, processor 1110 includes a memory controller 1114, which is operable to perform functions that enable the processor 1110 to access and communicate with memory 1130 that includes a volatile memory 1132 and/or a non-volatile memory 1134. In some embodiments, processor 1110 is coupled with memory 1130 and chipset 1120. Processor 1110 may also be coupled to a wireless antenna 1178 to communicate with any device configured to transmit and/or receive wireless signals. In one embodiment, the wireless antenna interface 1178 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 1132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1134 includes, but is not limited to, flash memory, phase change memory (PCM), read-only memory (ROM), electrically erasable programmable read-only memory (EEPROM), or any other type of non-volatile memory device.

Memory 1130 stores information and instructions to be executed by processor 1110. In one embodiment, memory 1130 may also store temporary variables or other intermediate information while processor 1110 is executing instructions. In the illustrated embodiment, chipset 1120 connects with processor 1110 via Point-to-Point (PtP or P-P) interfaces 1117 and 1122. The interfaces 1117 and 1122 may include one or more optical interfaces. Chipset 1120 enables processor 1110 to connect to other elements in system 1100. In some embodiments of the invention, interfaces 1117 and 1122 operate in accordance with a PtP communication protocol such as the Intel® QuickPath Interconnect (QPI) or the like. In other embodiments, a different interconnect may be used.

In some embodiments, chipset 1120 is operable to communicate with processor 1110, 1105N, display device 1140, and other devices 1172, 1176, 1174, 1160, 1162, 1164, 1166, 1177, etc. Buses 1150 and 1155 may be interconnected together via a bus bridge 1172. Chipset 1120 connects to one or more buses 1150 and 1155 that interconnect various elements 1174, 1160, 1162, 1164, and 1166. Chipset 1120 may also be coupled to a wireless antenna 1178 to communicate with any device configured to transmit and/or receive wireless signals. Chipset 1120 connects to display device 1140 via interface (I/F) 1126. Display 1140 may be, for example, a liquid crystal display (LCD), a plasma display, cathode ray tube (CRT) display, or any other form of visual display device. In some embodiments of the invention, processor 1110 and chipset 1120 are merged into a single SOC. In one embodiment, chipset 1120 couples with (e.g., via interface 1124) a non-volatile memory 1160, a mass storage medium 1162, a keyboard/mouse 1164, and a network interface 1166 via I/F 1124 and/or I/F 1126, I/O devices 1174, smart TV 1176, consumer electronics 1177 (e.g., PDA, Smart Phone, Tablet, etc.). One or more of interfaces 1124 and 1126 may be an optical interface implemented using one or more of the electro-optical circuit packages described herein.

In one embodiment, mass storage medium 1162 includes, but is not limited to, a solid state drive, a hard disk drive, a universal serial bus flash memory drive, or any other form of computer data storage medium. In one embodiment, network interface 1166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 11 are depicted as separate blocks within the system 1100, the functions performed by some of these blocks may be integrated within a single semiconductor circuit or may be implemented using two or more separate integrated circuits. For example, although cache memory 1116 is depicted as a separate block within processor 1110, cache memory 1116 (or selected aspects of 1116) can be incorporated into processor core 1112.

The devices, systems, and methods described can provide improved routing of interconnection between ICs for a multichip package in addition to providing improved transistor density in the IC die. Examples described herein include two or three IC dies for simplicity, but one skilled in the art would recognize upon reading this description that the examples can include more than three IC dice.

ADDITIONAL DESCRIPTION

Example 1 includes subject matter (such as an electronic device) comprising an electro-optical circuit package that includes a package substrate that includes at least one photonic integrated circuit (PIC) having at least one light source, a printed circuit board (PCB) including at least one optical connector to receive light from the at least one light source, and multiple liquid metal electrical contacts disposed between the package substrate and the PCB.

In Example 2, the subject matter of Example 1 optionally includes liquid metal electrical contacts that are included on the package substrate and a PCB that includes multiple pins to contact the multiple liquid metal electrical contacts. The multiple pins include at least one power pin longer than other pins of the multiple pins to provide power to the at least one light source.

In Example 3, the subject matter of one or both of Examples 1 and 2 optionally includes a PCB socket to receive the electro-optical circuit package, wherein the liquid metal electrical contacts are included on the PCB socket and an electro-optical circuit package that includes multiple pins to contact the multiple liquid metal electrical contacts, including a power pin longer than other pins of the multiple pins to provide power to the at least one light source.

In Example 4, the subject matter of one or any combination of Examples 1-4 optionally includes liquid metal electrical contacts that are included in an interposer contacting the package substrate.

In Example 5, the subject matter of one or any combination of the Examples 1-4 optionally includes an integrated heat spreader contacting the PIC, a package socket on the PCB to receive the electro-optical circuit package, one or more removable tabs in contact with one or both of the package substrate and the integrated heat spreader, and one or more removable landing pads for the one or more removable frames on the package socket.

In Example 6, the subject matter of Example 5 optionally includes a heat sink contacting the integrated heat spreader, and a clamp to attach the heat sink to the integrated heat spreader.

In Example 7, the subject matter of one or any combination of Examples 1-6 optionally includes a waveguide connected to the at least one optical connector, and a light sensor coupled to the waveguide and configured to detect light emitted from the PIC.

In Example 8, the subject matter of Example 7, including a positioning circuit operatively coupled to the waveguide and configured to produce one or more positioning control signals in response to light from the PIC.

In Example 9, the subject matter of one or both of Examples 7 and 8 optionally includes a waveguide embedded in the PCB.

In Example 10, the subject matter of one or any combination of Examples 1-9 optionally includes a light source of the PIC that is a vertical-emitting laser diode and the optical connector is arranged vertically from the electro-optical circuit package.

In Example 11, the subject matter of one or any combination of Examples 1-9 optionally includes a light source of the PIC that is a side-emitting laser diode and the optical connector is arranged adjacent to the electro-optical circuit package.

In Example 12, the subject matter of one or any combination of Examples 1-11 optionally includes a multi-zoned package socket including multiple movable socket zones, an electro-optical circuit package includes multiple light sources, and each movable socket zone including an optical connector aligned with a light source of the multiple light sources.

In Example 13, the subject matter of one or any combination of Examples 1-11 optionally includes a multi-zoned package socket including multiple movable socket zones, at least one additional electro-optical circuit package that includes at least one light source, and each movable socket zone including at least one optical connector aligned with the at least one light source of the multiple light sources.

Example 14 includes subject matter (such as a method of forming an electronic device) or can optionally be combined with one or any combination of Examples 1-13 to include such subject matter, comprising arranging a photonic integrated circuit (PIC) (that includes at least one light source) on a package substrate of an electro-optical circuit package, disposing multiple liquid metal electrical contacts on the package substrate, aligning position of the package substrate on a printed circuit board (PCB) by aligning light from the light source of the PIC and an optical connector included on the PCB, and attaching the aligned package substrate to the PCB.

In Example 15, the subject matter of Example 14 optionally includes providing power to the light source of the PIC from the PCB when the PCB and the package substrate are separated by an alignment separation, and reducing the alignment separation to attach the package substrate to the PCB.

In Example 16, the subject matter of Example 15 optionally includes sensing an optical signal from the light source of the PIC, producing one or more electrical control signals using the optical signal, and adjusting position of the package substrate relative to the PCB using a positioning mechanism responsive to the one or more electrical controls signals.

In Example 17, the subject matter of one or any combination of Examples 14-16 optionally includes including an integrated heat spreader with the electro-optical circuit package, and attaching one or more removable tabs to at least one of the electro-optical circuit package or the integrated heat spreader.

In Example 18, the subject matter of Example 17 optionally includes attaching the package substrate to a package socket of the PCB, and attaching one or more removable landing pads for the one or more removable tabs on the package socket.

Example 19 include subject matter (such as an electronic system) or can optionally be combined with one or any combination of Examples 1-18 to include such subject matter, comprising at least one electro-optical circuit package including one or more photonic integrated circuits (PICs) that include one or more multiple light sources, a package substrate, multiple liquid metal electrical contacts on the package substrate; and a printed circuit board (PCB) including a package socket, wherein the package socket includes multiple socket zones, wherein each socket zone includes an optical connector aligned with a light source of the multiple light sources.

In Example 20, the subject matter of Example 19 optionally includes multiple waveguides, including a waveguide connected to each of the optical connector; and multiple light sensors, including a light sensor coupled to each waveguide of the multiple waveguides, each light sensor configured to detect light emitted from a light source of the electro-optical circuit package.

In Example 21, the subject matter of one or both of Examples 19 and 20 optionally include an electro-optical circuit package that includes an integrated heat spreader contacting the one or more PICs; a removable frame in contact with one or both of the package substrate and the integrated heat spreader; a first removable landing pad for the removable frame on the package socket; and a second removable landing pad for the removable frame on the PCB.

In Example 22, the subject matter of one or any combination of Examples 19-21 optionally includes a PCB including multiple pins connected to the multiple liquid metal electrical contacts. The multiple pins including multiple power pins that provide power to the multiple light sources of the electro-optical circuit package, and the multiple power pins are longer than other pins of the PCB.

In Example 23, the subject matter of one or any combination of Examples 19-22 optionally includes an array of multiple electro-optical circuit packages each electro-optical circuit package including at least one light source aligned with at least one optical connector of a socket zone.

These non-limiting examples can be combined in any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An electronic device comprising:
an electro-optical circuit package including:
at least one photonic integrated circuit (PIC) including at least one light source; and
a package substrate;
a printed circuit board (PCB) including at least one optical connector to receive light from the at least one light source; and
multiple liquid metal electrical contacts disposed between the package substrate and the PCB.

2. The electronic device of claim 1,
wherein the liquid metal electrical contacts are included on the package substrate; and
wherein the PCB includes multiple pins to contact the multiple liquid metal electrical contacts, including a power pin longer than other pins of the multiple pins to provide power to the at least one light source.

3. The electronic device of claim 1, including:
a PCB socket to receive the electro-optical circuit package, wherein the liquid metal electrical contacts are included on the PCB socket; and
wherein the electro-optical circuit package includes multiple pins to contact the multiple liquid metal electrical contacts, including a power pin longer than other pins of the multiple pins to provide power to the at least one light source.

4. The electronic device of claim 1, wherein the liquid metal electrical contacts are included in an interposer contacting the package substrate.

5. The electronic device of claim 1, including:
an integrated heat spreader contacting the PIC;
a package socket on the PCB to receive the electro-optical circuit package;
one or more removable tabs in contact with one or both of the package substrate and the integrated heat spreader; and
one or more removable landing pads for the one or more removable frames on the package socket.

6. The electronic device of claim 5, including:
a heat sink contacting the integrated heat spreader; and
a clamp to attach the heat sink to the integrated heat spreader.

7. The electronic device of claim 1, including:
a waveguide connected to the at least one optical connector; and
a light sensor coupled to the waveguide and configured to detect light emitted from the PIC.

8. The electronic device of claim 7, including a positioning circuit operatively coupled to the waveguide and configured to produce one or more positioning control signals in response to light from the PIC.

9. The electronic device of claim 7, wherein the waveguide is embedded in the PCB.

10. The electronic device of claim 1, wherein the light source of the PIC is a vertical-emitting laser diode and the optical connector is arranged vertically from the electro-optical circuit package.

11. The electronic device of claim 1, wherein the light source of the PIC is a side-emitting laser diode and the optical connector is arranged adjacent to the electro-optical circuit package.

12. The electronic device of claim 1, including:
a multi-zoned package socket including multiple movable socket zones;
wherein the electro-optical circuit package includes multiple light sources; and
wherein each movable socket zone includes an optical connector aligned with a light source of the multiple light sources.

13. The electronic device of claim 1, including:
a multi-zoned package socket including multiple movable socket zones;
at least one additional electro-optical circuit package that includes at least one light source; and
wherein each movable socket zone includes at least one optical connector aligned with the at least one light source of the multiple light sources.

14. A method of forming an electronic device, the method comprising:
arranging a photonic integrated circuit (PIC) on a package substrate of an electro-optical circuit package, wherein the PIC includes at least one light source;
disposing multiple liquid metal electrical contacts on the package substrate;
aligning position of the package substrate on a printed circuit board (PCB) by aligning light from the light source of the PIC and an optical connector included on the PCB; and
attaching the aligned package substrate to the PCB.

15. The method of claim 14, wherein the aligning the position of the package substrate includes:
providing power to the light source of the PIC from the PCB when the PCB and the package substrate are separated by an alignment separation; and
reducing the alignment separation to attach the package substrate to the PCB.

16. The method of claim 15, wherein the aligning the position of the package substrate includes:
sensing an optical signal from the light source of the PIC;
producing one or more electrical control signals using the optical signal; and
adjusting position of the package substrate relative to the PCB using a positioning mechanism responsive to the one or more electrical controls signals.

17. The method of claim 14, including:
including an integrated heat spreader with the electro-optical circuit package; and
attaching one or more removable tabs to at least one of the electro-optical circuit package or the integrated heat spreader.

18. The method of claim 17, including:
wherein the attaching the package substrate to the PCB includes attaching the package substrate to a package socket of the PCB; and
wherein the method further includes attaching one or more removable landing pads for the one or more removable tabs on the package socket.

19. An electronic system, the system comprising:
at least one electro-optical circuit package including:
one or more photonic integrated circuits (PICs) that include one or more multiple light sources;
a package substrate; and
multiple liquid metal electrical contacts on the package substrate; and
a printed circuit board (PCB) including a package socket, wherein the package socket includes multiple socket zones, wherein each socket zone includes an optical connector aligned with a light source of the multiple light sources.

20. The system of claim 19, including:
multiple waveguides, including a waveguide connected to each of the optical connector; and
multiple light sensors, including a light sensor coupled to each waveguide of the multiple waveguides, each light sensor configured to detect light emitted from a light source of the electro-optical circuit package.

21. The system of claim 19, including:
wherein the electro-optical circuit package includes an integrated heat spreader contacting the one or more PICs;
a removable frame in contact with one or both of the package substrate and the integrated heat spreader;
a first removable landing pad for the removable frame on the package socket; and
a second removable landing pad for the removable frame on the PCB.

22. The system of claim 19, wherein the PCB includes multiple pins connected to the multiple liquid metal electrical contacts, including multiple power pins that provide power to the multiple light sources of the electro-optical circuit package, and wherein the power pins are longer than other pins of the PCB.

23. The system of claim 19, including an array of multiple electro-optical circuit packages each electro-optical circuit package including at least one light source aligned with at least one optical connector of a socket zone.

* * * * *